United States Patent
Verbrugge et al.

(10) Patent No.: US 10,620,275 B2
(45) Date of Patent: Apr. 14, 2020

(54) STATE ESTIMATION OF AN ENERGY SYSTEM

(71) Applicant: GM Global Technology Operations LLC, Detroit, MI (US)

(72) Inventors: Mark W. Verbrugge, Troy, MI (US); Charles W. Wampler, Birmingham, MI (US); Bob R. Powell, Jr., Birmingham, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 259 days.

(21) Appl. No.: 15/246,609

(22) Filed: Aug. 25, 2016

(65) Prior Publication Data
US 2018/0059190 A1     Mar. 1, 2018

(51) Int. Cl.
| | | |
|---|---|---|
| *G01R 31/396* | (2019.01) | |
| *G01R 31/3842* | (2019.01) | |
| *G01R 31/367* | (2019.01) | |
| G01R 31/392 | (2019.01) | |
| G01R 31/40 | (2020.01) | |

(52) U.S. Cl.
CPC ......... *G01R 31/396* (2019.01); *G01R 31/367* (2019.01); *G01R 31/3842* (2019.01); *G01R 31/392* (2019.01); *G01R 31/40* (2013.01)

(58) Field of Classification Search
None
See application file for complete search history.

(56) References Cited

U.S. PATENT DOCUMENTS

| | | | | | |
|---|---|---|---|---|---|
| 3,518,536 | A | * | 6/1970 | Lee | G01D 5/244 307/118 |
| 6,160,382 | A | * | 12/2000 | Yoon | G01R 31/389 320/136 |
| 7,768,233 | B2 | * | 8/2010 | Lin | H01M 10/441 320/132 |
| 2011/0309838 | A1 | * | 12/2011 | Lin | G01R 31/3624 324/427 |
| 2012/0235473 | A1 | * | 9/2012 | Jiang | H01M 2/1072 307/9.1 |
| 2013/0138369 | A1 | * | 5/2013 | Papana | G01R 31/3644 702/63 |
| 2013/0218496 | A1 | * | 8/2013 | Koch | G01R 31/3651 702/63 |
| 2015/0301116 | A1 | | 10/2015 | Baker et al. | |
| 2016/0039419 | A1 | | 2/2016 | Wampler et al. | |
| 2016/0077160 | A1 | | 3/2016 | Wampler, II et al. | |

FOREIGN PATENT DOCUMENTS

| | | |
|---|---|---|
| CN | 101221224 A | 7/2008 |
| CN | 103020445 A | 4/2013 |
| CN | 103149535 A | 6/2013 |
| CN | 103534135 A | 1/2014 |
| CN | 105539169 A | 5/2016 |

\* cited by examiner

*Primary Examiner* — Nasima Monsur
(74) *Attorney, Agent, or Firm* — Lorenz & Kopf, LLP

(57) ABSTRACT

A number of variations may include products and methods for estimating the state of an energy system. At least one sensor may monitor a voltage and a current of the energy storage system. An electronic controller may be communicatively coupled with the energy storage system and may receive input from the sensor. A circuit may be representative of the energy storage system and may be appropriately defined in the electronic controller. The circuit may estimate a state of the energy storage system from a reading of the voltage and the current.

20 Claims, 9 Drawing Sheets

STATE ESTIMATION OF AN ENERGY SYSTEM

TECHNICAL FIELD

The field to which the disclosure generally relates includes products and methods for energy system estimation and more particularly, includes state estimation in complex energy systems that may contain one or more types of electrical storage devices.

BACKGROUND

Electrical energy systems may include one or more storage devices such as a battery or a number of batteries, or various combinations of batteries and supercapacitors. Batteries may store energy electrochemically, where chemical reactions may release electrical carriers such as electrons into an external circuit (and ions into the internal circuit) to accomplish results. In a capacitor/supercapacitor energy may be stored electrostatically on a material surface, which surface may release electrical carriers without a chemical reaction, such as into a circuit to accomplish results. A supercapacitor may be a high-capacity capacitor that may operate in any of a number of ways such as with electrostatic double-layer capacitance or electrochemical capacitance. Other types of electric-energy storage devices may exist or may be under development. The various storage devices may be employed in wide ranging applications. In use, the storage devices may be discharged and as a result, provisions may be included for recharging. The cycling nature resulting from discharging means that the storage devices may operate over a range of states.

SUMMARY OF SELECT ILLUSTRATIVE VARIATIONS

A number of variations may involve a product for estimating the state of an energy system. At least one sensor may monitor a voltage and a current of the energy storage system. An electronic controller may be communicatively coupled with the energy storage system and may receive input from the sensor. A circuit may be representative of the energy storage system and may be appropriately defined in the electronic controller. The circuit may estimate a state of the energy storage system from a reading of the voltage and the current.

A number of additional variations may involve a method such as providing an energy storage system that at a given time may have a composite system voltage and a composite system current. One or more storage devices may be assembled in the energy storage system. A model of the energy storage system may be constructed that may have an individual branch that may correspond to each individual storage device of the one or more storage devices. The composite system voltage and the composite system current may be measured. A state of the energy storage system may be determined from the model and based on the composite system voltage and the composite system current.

Other illustrative variations within the scope of the invention will become apparent from the detailed description provided hereinafter. It should be understood that the detailed description and specific examples, while disclosing variations within the scope of the invention, are intended for purposes of illustration only and are not intended to limit the scope of the invention.

BRIEF DESCRIPTION OF THE DRAWINGS

Select examples of variations within the scope of the invention will become more fully understood from the detailed description and the accompanying drawings, wherein.

DETAILED DESCRIPTION OF ILLUSTRATIVE VARIATIONS

Figure 1:
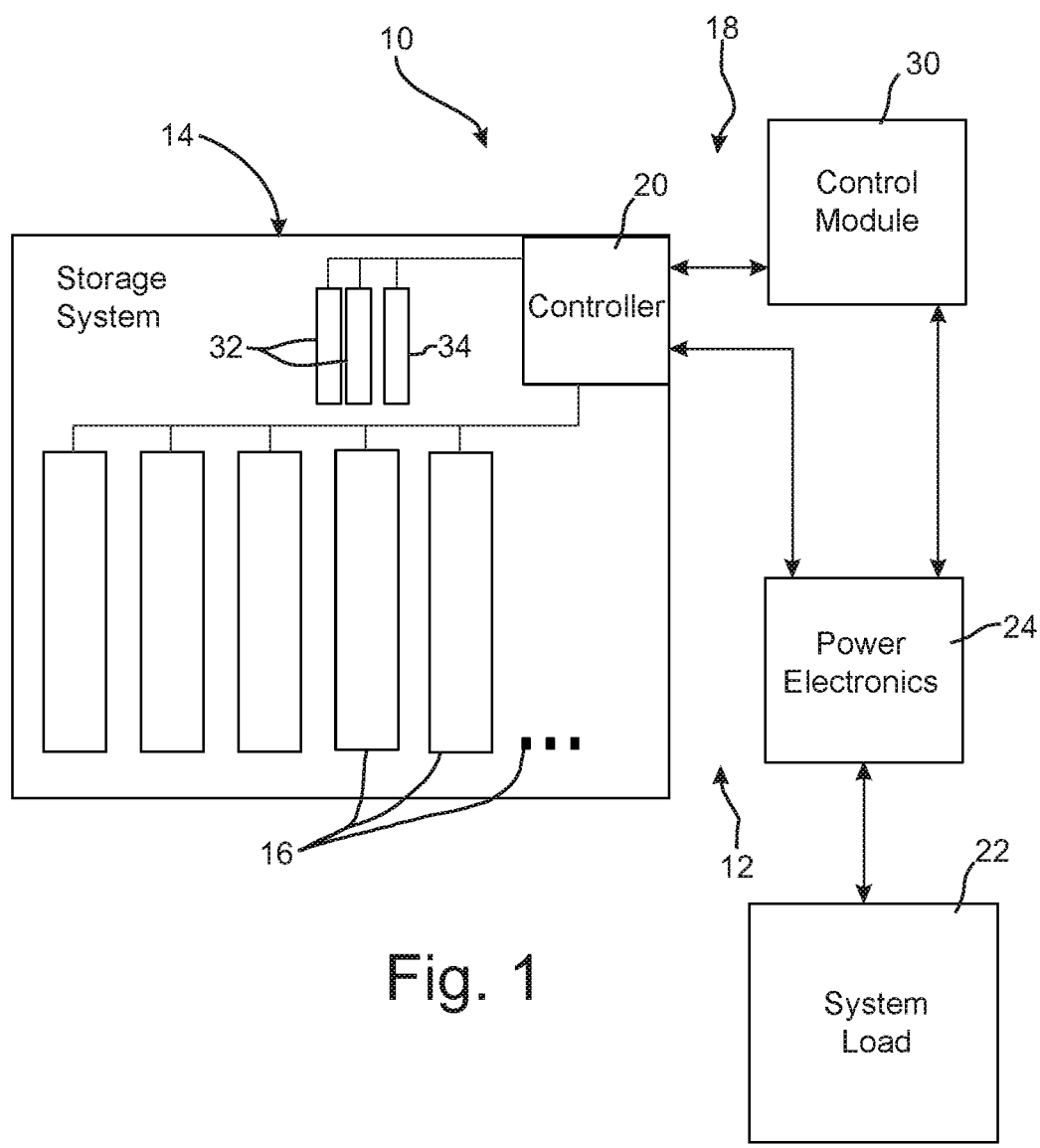
FIG. 1 illustrates a diagrammatic representation of a product involving an energy system according to a number of variations.

The following description of the variations is merely illustrative in nature and is in no way intended to limit the scope of the invention, its application, or uses.

A number of variations may involve arranging one or more storage devices in a desirable architecture for the application. A model may be built for use in estimating the "state" of an energy system with a storage device or with multiple storage devices. The state in question may include any of a number of parameters such as State-of-Power (SOP), State-of-Charge (SOC), State-of-Health (SOH), and State-of-Life (SOL), or other useful indicators to consider in using and/or in optimizing the functionality and life of the storage device. In a number of variations, a model may have multiple segments, one of which may correspond to each storage device that may be included in the system. Each of the segments may have multiple components that may take multiple effects into consideration. One or more components may include linear equivalent circuit(s), such as may be built using an $N^{th}$ order linear ordinary differential equation. The linear equivalent circuit(s) may provide an analog to the behavior of a storage device from which conclusions/estimates can be drawn to determine a state. One or more components may include nonlinear element model(s), such as may be built using characterization testing data. The nonlinear element(s) may extend the capability/functionality of the model in determining the state. The arrangement of the model components and segments may enable state estimation in energy systems with both simple and complex energy storage arrangements. This may advantageously be accomplished with the input of only a single current and a single voltage input. Accordingly, the model may enable a simplified hardware implementation even when multiple storage devices are included. For example, the state of an energy system with multiple batteries and/or multiple supercapacitors may be determined with a single current and voltage sensor device. The model may be coded to reside in an electronic controller, which may be an embedded controller in the energy system, or a remote unit. The single current and voltage values may be obtained from the sensors and delivered to the electronic controller. The electronic controller may report information such as regressed system parameter values (such as of model components), state of charge (such as how much energy the system can deliver), state of power (for discharge and charge), and/or other desired values. The values may be reported to other controllers (such as a master controller), or to other systems for output, as input for further computation, or as data for historical or other uses/effects. The variations described herein are intended to be applicable to all normal operating conditions of the applicable energy system. For example only, the state estimations may be effectively made in vehicle energy storage systems, including high-power applications (such as vehicle start-stop) and extended range applications, but the applications of the variations described herein are not so limited.

In a number of variations as illustrated in FIG. 1, a product 10 may include an energy system 12 that may include a storage system 14 with one or more storage device(s) 16. The storage system 14 may be any suitable electrical energy storage system or combination that may employ any of a variety of base forms to provide the required energy density, specific energy, power density, cost, and durability appropriate for the application. In a number of variations the storage device(s) 16 may be one battery, plural batteries, one supercapacitor, plural supercapacitors, one or more batteries and one or more supercapacitors, or any number of other types of storage devices alone, or along with any of the foregoing. Any included battery may use a type of lithium ion, lead-acid, nickel-metal-hydride, or any other composition known in the art including those yet to be commercialized; e.g., air- and sulfur-based batteries. Any included supercapacitor may be an electrochemical capacitor, an electrolytic capacitor, or any other capacitor construction appropriate for the application.

The energy system 12 may operate with a system load 22 that may perform at-least in-part, using current supplied by the storage system 14. In a number of variations, the system load 22 may operate to charge the storage system 14. For example, the system load may include a machine (not separately illustrated), that may operate as a generator. In a number of variations power electronics 24 may be included and may serve as a connection between the storage system 14 and the system load 22. In a number if variations, the power electronics 24 may include a power inverter-converter unit that may invert DC current to AC current to supply any AC circuit needs of the product 10 that may exist. Power electronics 24 may also include a DC to DC converter to step up the voltage supplied by the storage system 14 to a voltage value that may be required by the application. The power electronics 24 may also include various sensors and circuits such as may be provided for monitoring, protection, filtering and control.

The storage system 14 may include or may communicatively connect into a control system 18 that may include an electronic controller 20. The electronic controller 20 may be an embedded controller with the storage system 14, or may be remote. The control system 18 may be configured to monitor and/or control certain aspects of the product 10 including of the storage system 14. The electronic controller 20 may interface with a control module 30 that may communicatively connect with a number of elements in the product 10, and that may interface with other products. The control module 30 may connect with the storage system 14, the system load 22, the power electronics 24, and other various elements to monitor and control operation. Although the control module 30 is shown as one discrete element, the functions of the control module 30 may be provided by a number of intercommunicating modules that may be placed in various locations, which may include being integrated into various controlled units. Communication may be achieved through direct connections, a network bus, wireless connections, or other forms of interface. Referenced control modules, controllers, processors or similar terms may describe one or more of electronic circuits, processors, including associated memory and storage, executing one or more software or firmware programs, logic circuits, and other devices, along with other suitable components to provide the desired functionality. The electronic controller(s)/control module(s) or other control device(s) may operate according to a number of control algorithms, instructions and programs stored in memory and executed to provide various functions. Memory may be volatile or non-volatile and may be read-only, programmable, random access, hard drive, or other types.

In a number of variations, the control system 18 may be configured to monitor and control charging, discharging, and/or balancing operations of the storage system 14. The control system 18 may operate using the approaches described herein to estimate, model, and/or otherwise determine battery system state information. In a number of variations, the control system 18 may be communicatively connected with one or more sensor(s) 32 that may include voltage sensors, current sensors, and/or other typical sensors, to enable monitoring and/or control operations, and/or to perform operations disclosed herein. In a number of variations, the sensor(s) 32 may provide the control system 18 with information used to estimate SOP, SOC, SOH, SOL, estimate an impedance, measure a current, measure voltage of a storage system 14, and/or any other information that may be utilized in connection with the variations described herein. In addition, a temperature sensor 34 may monitor the temperature of the storage system 14 and may communicate temperature data to the control system 18. In a number of variations the control system 18 may be coupled with an external computer system (not shown), through a wired and/or wireless communication system to provide information or control functions from/to the product 10. The product 10 may employ any of circuits, systems, devices and/or machines that may employ DC and/or AC current at a given voltage or at various voltages.

Figure 2:
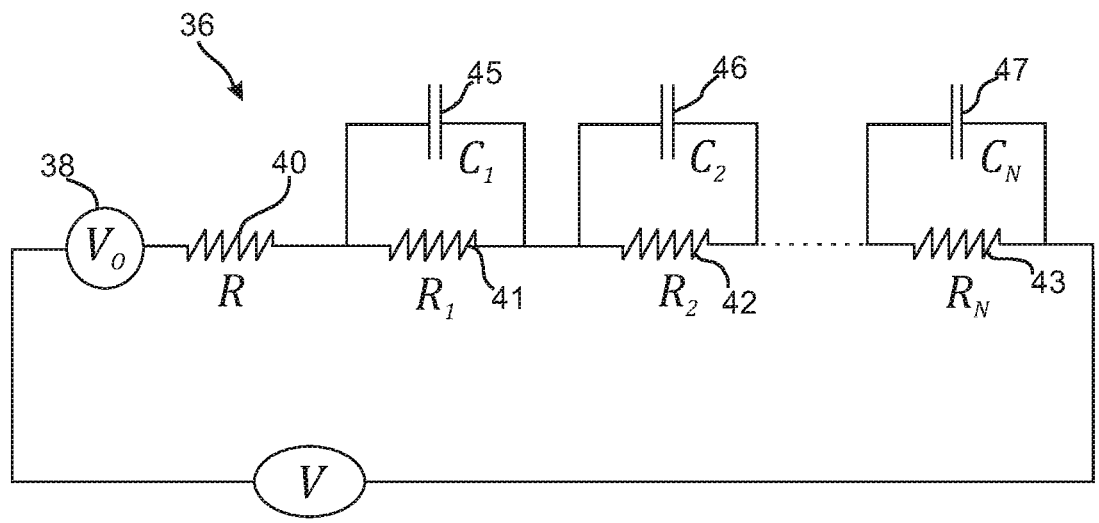
FIG. 2 illustrates a diagram of a linear equivalent circuit model including a resistor in series with N R||C pairs according to a number of variations.
Figure 3:
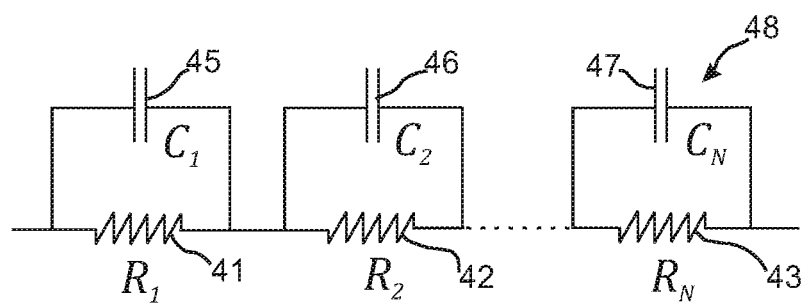
FIG. 3 illustrates a diagram of a linear equivalent circuit model including a resistor in series with N R||C pairs according to a number of variations.

In a number of variations the control system 18 may model the storage system 14 using a component such as the linear equivalent circuit model 36 of FIG. 2, which may be represented in code residing and executed in the control system 18. The linear equivalent circuit model may be represented as an R+N(R∥C) circuit, where N is the number of the parallel resistor-capacitor combinations. A circuit consisting of resistors and capacitors connected in an arbitrary fashion may have the same impedance as an appropriately chosen R+N(R∥C) circuit. The parallel RC network in series may be used to describe the dynamic characteristics of the storage system 14. The linear equivalent circuit model 36 may include open-circuit voltage 38, internal resistances 40, 41, 42, 43, and equivalent capacitances 45, 46, 47. The internal resistances may include ohmic resistance 40 and the polarization resistance 41, 42, 43. The equivalent capacitances 45, 46, 47 may be used to describe a transient response such as during charging and discharging. The voltage across the entire circuit may be V−V$_O$, where V is the storage system voltage and V$_O$ represents the open-circuit voltage for the storage system (i.e., V=V$_O$ when the storage system current is zero). The linear equivalent circuit model 36 may be constructed such as by collecting electrochemical impedance spectroscopy data for the storage devices 16 over state and temperature ranges of interest, and may include fitting the electrochemical impedance spectroscopy data with an equivalent circuit over the temperature and SOC range. In a number of variations the equivalent circuit may have the fewest number of resistors, capacitors and inductors. In a number of variations the method may include using real-time linear regression, which may be a method of estimating future behavior of a system based on current and previous data points, to provide an adaptive impedance response approximator/estimator. Linear regression may be performed by forming an RC circuit which is "equivalent" to electrochemical impedance spectroscopy data and processing the runtime values of that RC circuit using any number of known real-time linear regression algorithms including, but not limited to a weighted recursive least squares (WRLS), Kalman filter or other means. Analytic power expressions may be derived for the R+N (R∥C) circuits. Certain methods for creating a linear equivalent circuit model 36 are disclosed in U.S. patent application Ser. No. 14/257,572, entitled State of Charge Estimator and Methods of Making and Using Same, which was filed Apr. 21, 2014, was published Oct. 22, 2015 as publication US 2015-0301116 A1, which is commonly assigned, and which is specifically incorporated herein by reference, in its entirety. The R+N(R∥C) circuit may be represented in the models described herein by the version shown as linear equivalent circuit model 48, illustrated in FIG. 3. In addition, in a number of variations other suitable representative circuit models demonstrating linear behavior of the storage system 14 may be used in connection with the variations described herein. An appropriate circuit may include resistors, capacitors, and/or inductors, a configuration of serially-coupled parallel resistor-resistor capacitor pairs, serially-coupled resistors and/or capacitors, elements modeling a general Laplace transform for impedance, elements modeling a general linear ordinary differential equation, elements modeling a Finite Impulse Response filter, and/or other suitable approaches. A number of such approaches are described in U.S. patent application Ser. No. 14/488,906, entitled Battery Impedance and Power Capability Estimator and Methods of Making and Using the Same, which was filed Sep. 17, 2014, was published Mar. 17, 2016 as publication US 2016-0077160 A1, which is commonly assigned, and which is specifically incorporated herein by reference, in its entirety.

Figure 4:
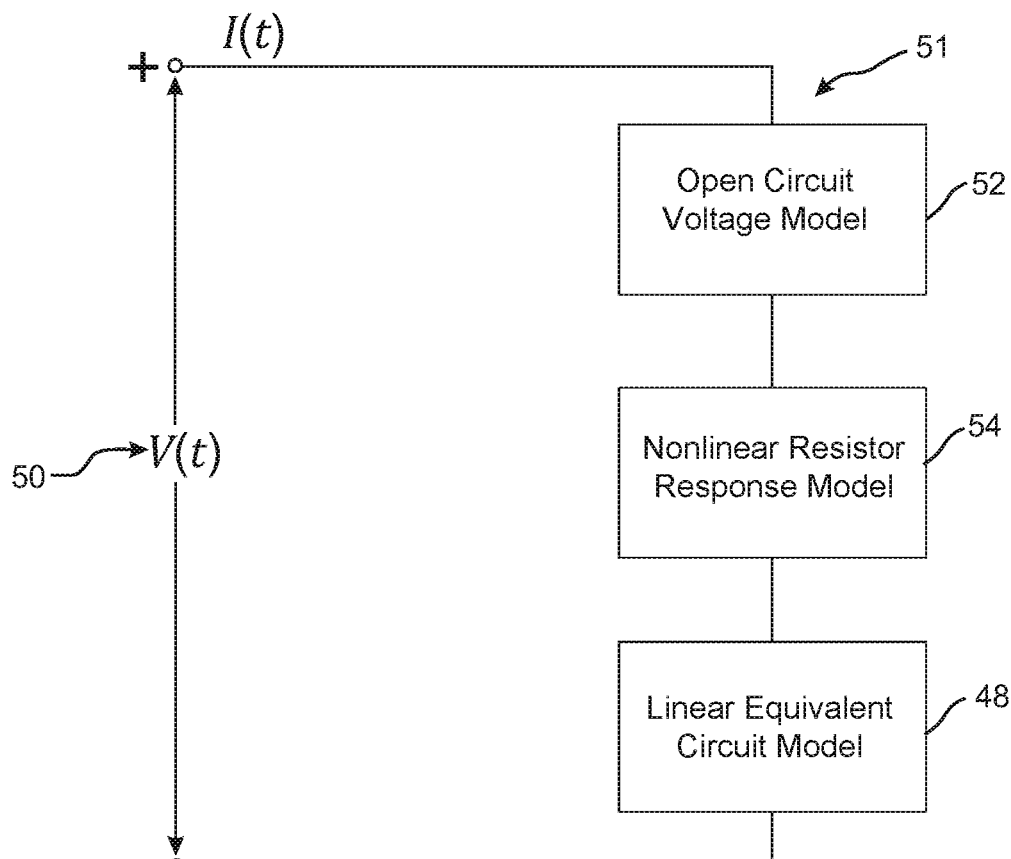
FIG. 4 illustrates a diagram of a model for use with an energy system according to a number of variations.
Figure 5:
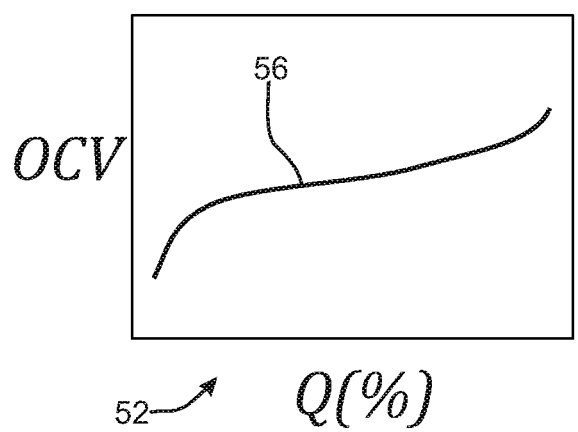
FIG. 5 is a detail illustration of a component of the model of FIG. 4.
Figure 6:
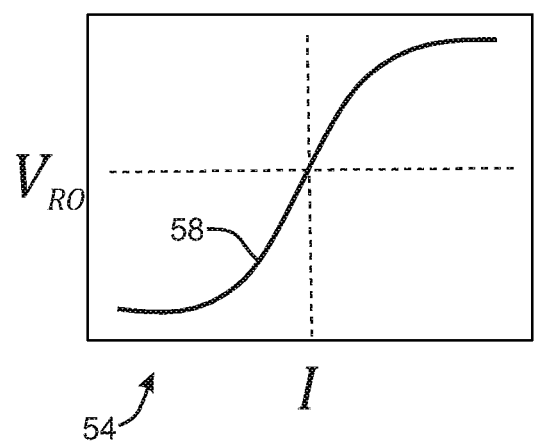
FIG. 6 is a detail illustration of a component of the model of FIG. 4.

While in a number of variations the R+N(R∥C) circuit model 36, 48 may be sufficient for matching to data, it may be desirable to consider other classes of model components because they may provide a convenient physical interpretation for known battery effects. With reference to FIG. 4, the storage device 16 (FIG. 1), representative voltage 50 may be predicted through the model 51. The model 51 may include a sum of three effects such that: V=OCV+V$_{RO}$+V$_L$, where: V is the voltage 50, OCV is open circuit voltage model 52, which may be represented as a function of storage device capacity (Q), and temperature (T), V$_{RO}$ is nonlinear resistor response model 54, which may be represented as a function of current (I), Q, and T, and V$_L$ is the response from the linear equivalent circuit model 48. In a number of variations OCV 52 may be implemented as look-up table(s) where OCV may be plotted as a function of SOC/percent of capacity charged, for various temperatures. For example, as illustrated in FIG. 5, OCV may be plotted by the curve 56 at a given temperature. The parameter OCV may represent the steady terminal voltage of the storage device 16 in open circuit, which increases non-linearly with the battery SOC. One method through which the curve may be constructed, may be through collected data such as through characterization testing where OCV may be determined by performing charge and discharge tests under controlled conditions and monitoring terminal voltage and current. The curve 56 is intended to represent a number of curves each of which may be constructed collecting data at a discrete temperature, over a range of temperatures that may typically be experienced by the storage device 16. In a number of variations, OCV may be adjusted to account for aging of the involved storage device 16. In a number of variations, nonlinear resistor response model 54 (V$_{RO}$), may be parameterized such as through characterization testing, which may include using a constant current pulse test where the voltage response when the pulse is applied may be monitored. The curve 58 as shown in FIG. 6 may represent the nonlinear response at various currents at a discrete temperature, and is intended to represent a number of such curves over a range of temperatures that may typically be experienced by the storage device 16. Other methods of parameterization may be as disclosed in U.S. patent application Ser. No. 14/887, 926, entitled Battery State Estimation Systems and Methods Using a Nonlinear Resistance Element, which was filed Oct. 20, 2015, was published Feb. 11, 2016 as publication US 2016-0039419 A1, which is commonly assigned, and which is specifically incorporated herein by reference, in its entirety. In a number of variations, the OCV model 52, nonlinear resistor response model 54, and linear equivalent circuit model 48 may be connected in series to represent the state of a storage device 16.

Figure 7:
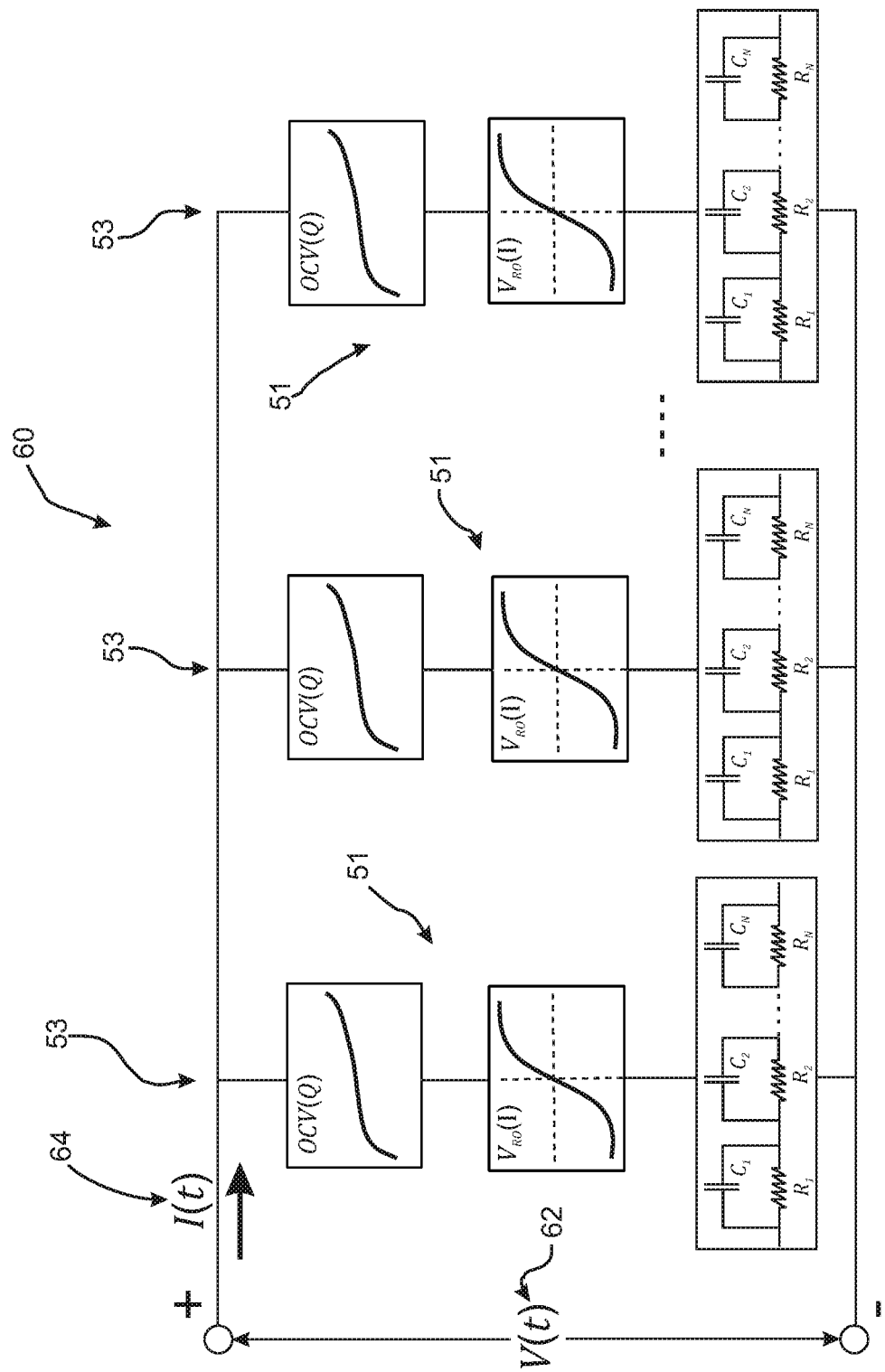
FIG. 7 illustrates a diagram of a model for use with an energy system according to a number of variations.

In a number of variations the model 51 of FIG. 4 may be incorporated as one or more components into the model 60 of FIG. 7. In a number of variations a plural number of the model 51 may be arranged in parallel, each as a branch 53 of the model 60. The model 60 may include N components of the model 51 connected in the parallel branches 53, where N is the number of storage devices 16 included in the storage system 14. As an example only, when the storage system 14 includes five storage devices 16, five components of the model 50 may be included in the model 60. Using this approach, one reading of storage system 14 voltage 62 and one reading of storage system 14 current 64 can be used to predict the state of the entire storage system 14. The state estimation may be applicable to all normal operating conditions of the energy system 12. In a number of variations, the sensor(s) 32 may include only one current sensor and only one voltage sensor. A simultaneous measurement of current and voltage may be obtained using the sensor(s) 32, in intervals such as 0.1 seconds, for real time estimation of the state. Since the entire storage system 14 is represented by the model 60 and each individual storage device 16 is represented by a designated branch 53, the composite state of the storage system 14 may be determined and the individual state of each storage device 16 may be determined. These determinations may be made based on one reading of the composite current and voltage for the entire storage system 14 for use in the model 60 for input at 64, 62. In a number of variations, the composite current may be defined as the storage system 14 current, and the composite voltage may be defined as the storage system 14 voltage, in each case as opposed to that of a single storage device or cell. In a number of variations, the individual storage device(s) 16 may be of one type, or multiple types as described above. Accordingly, the model 60 is adaptable to different energy systems with reduced integration costs. In a number of variations, temperature may be obtained in intervals, such as every ten seconds, for use in the model 60. In a number of variations, the electronic controller 20 and/or the control module 30 may be constructed and arranged to receive state related input from the model 60, which may be compared with predetermined values to generate a signal representative of the state, or effect other action when the input is within a predetermined range of the predetermined values indicative of a response.

Figure 8:
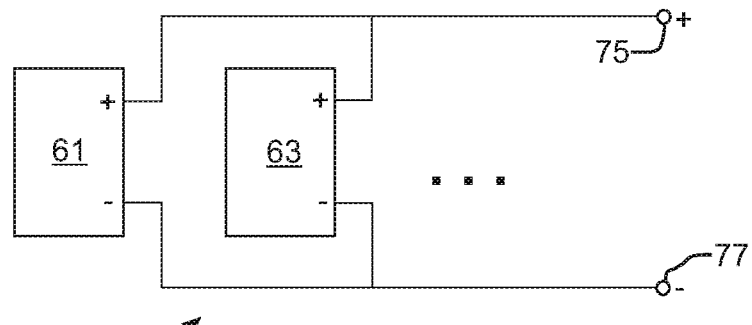
FIG. 8 illustrates a diagrammatic representation of a product involving a battery system according to a number of variations.

The variations described herein, such as the approach of FIG. 4, may be applied in different types of storage devices. In a number of variations as illustrated in FIG. 8, a battery system 59 may include multiple types of batteries which for example, may include one or more lithium ion batteries 61 and may include one or more lead-acid batteries 63. The batteries 61, 63 may be connected in parallel and may be a part of a larger system that includes additional batteries. The battery system 59 may have two terminals 75, 77 from which a composite voltage and current reading may be taken, such as by the sensors 32, for the purpose of estimating a state, or a number of states of the battery system 59. The batteries 61, 63 may have significantly different response characteristics. The two types of batteries may complement each other in supporting the requirements of the product served by the battery system 59, and may enhance each other's performance during discharge and charge. For example, lithium ion have a fairly flat discharge curve while lead-acid may have a more pronounced slope. The model used for estimating states of the battery system 59 may have a number of branches corresponding to the number of batteries. These branches may differ in whether they are linear or nonlinear, and/or in whether asymmetry for positive and negative currents is included, as discussed below. For example, the lead-acid battery 63 may exhibit a linear relationship between voltage and SOC, whereas with the lithium ion battery 61 may have a nonlinear response. Accordingly, the model used with the different battery types 61, 63 may have a linear branch for each lead-acid battery and a nonlinear branch for each lithium ion battery.

Figure 9:
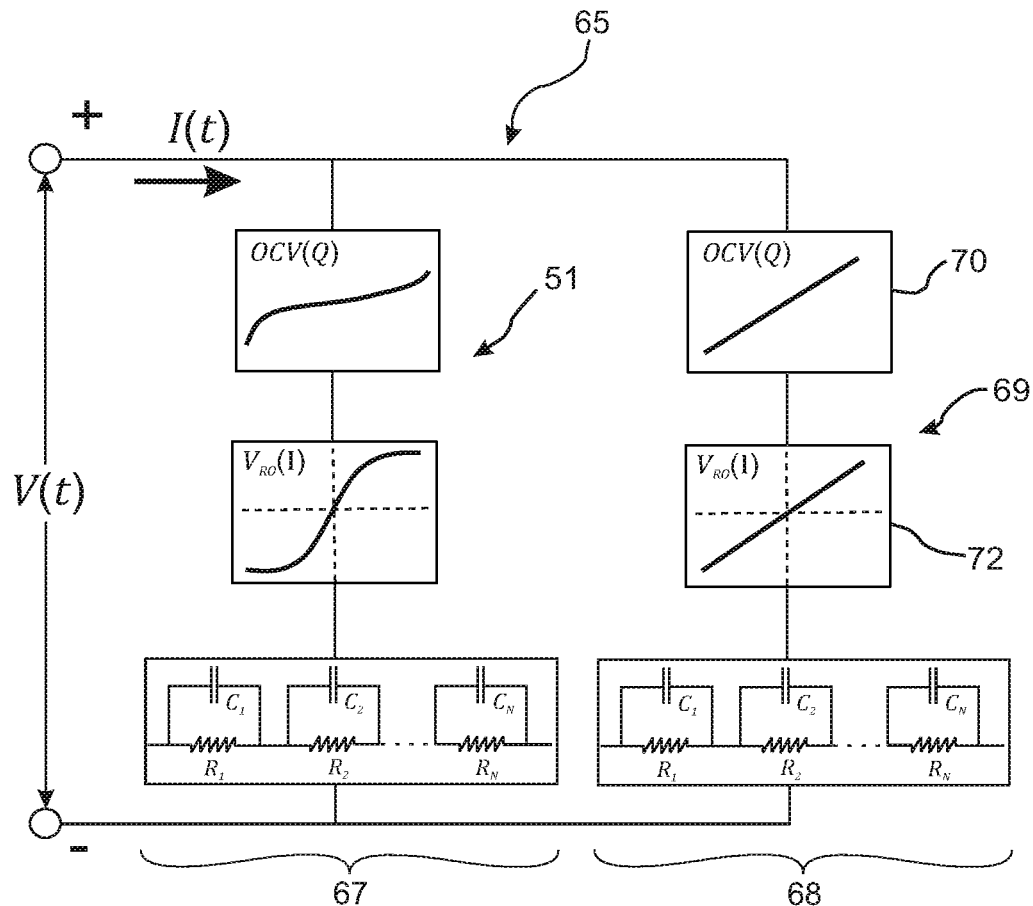
FIG. 9 illustrates a diagram of a model for use with an energy system according to a number of variations.

In a number of variations where an included supercapacitor may have no Faradaic reaction, the OCV(Q,T) and $V_{RO}$(I,Q,T) elements may react linearly such that: OCV=CQ and $V_{RO}$=IR(Q,T), where C is the capacity and R(Q,T) is a resistance that depends on SOC and temperature. In a number of variations as illustrated in FIG. 9, the model may be modified into a model 65 such as in a case with a supercapacitor, or other device, as a storage device that exhibits linear responses resulting in OCV model 70 and linear resistor response model 72. The OCV model 70 and linear resistor response model 72 may be determined according to the same methods described above for nonlinear responses. In the model 65, any storage devices 67 that exhibit nonlinear responses may be represented with the model 51 component, and any storage devices 68 that exhibit a linear response may be represented by the model 69 component.

Figure 10:
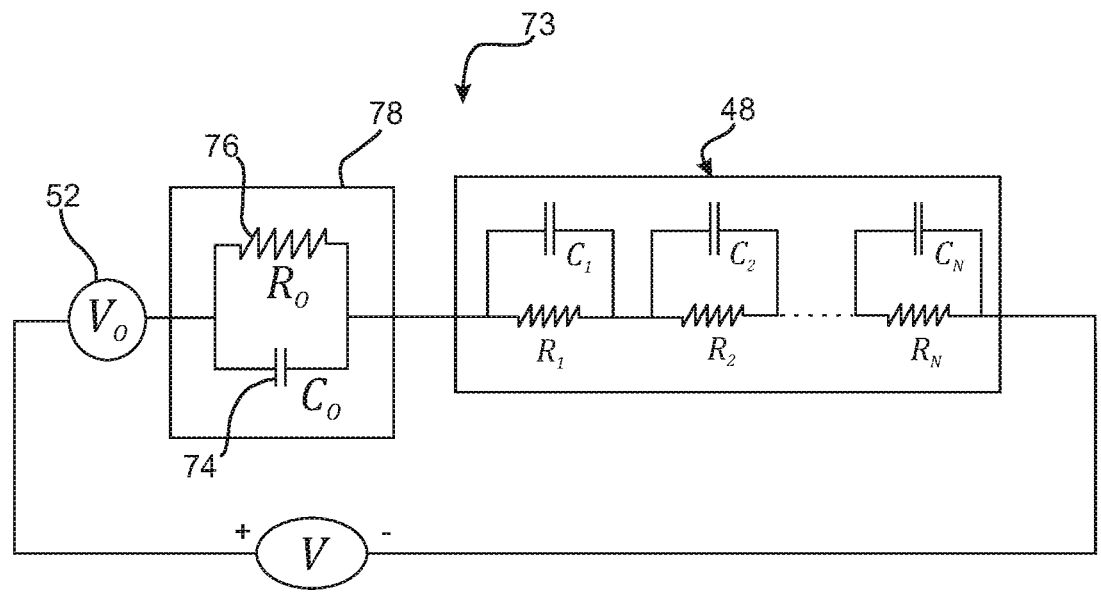
FIG. 10 illustrates a diagram of a model for use with an energy system according to a number of variations.

In storage devices, electrochemistry may predict a current/voltage relationship at an electrode to follow (for each elementary reaction), the Butler-Volmer equation:

$$I = A \cdot j_0 \left\{ \exp\left[\frac{\alpha_1 nF}{RT}(V - V_0)\right] - \exp\left[-\frac{\alpha_2 nF}{RT}(V - V_0)\right] \right\}$$

where: I=current, $j_o$=exchange current density, A=electrode surface area, $\alpha_{1,2}$=transfer coefficients for the oxidation and reduction processes, n=number of electrons transferred in the electrochemical reaction, F=Faraday constant, R=universal gas constant, T=absolute temperature, $V_o$=equilibrium/open-circuit voltage of the cell, and V=voltage of the cell. The Butler-Volmer equation is known to be used, such as to account for the electrochemical reactions that take place in battery electrodes, and may describe how the electrical current on an electrode depends on the electrode potential, According to the Butler-Volmer model, resistance may decrease for relatively larger deviations from the OCV. In a number of variations, the Butler-Volmer equation may be used in parameterizing models. In a number of variations as illustrated in FIG. 10, some electrochemical devices such as in high-power batteries that may employ high-surface-area electrodes, the Butler-Volmer effect may have an associated capacitance that may be desirably considered to address the surface effects. In such a case, the model may be modified to the model 73. A linear capacitor 74 may be placed in parallel to the nonlinear resistance 76 in the nonlinear model component 78. The linear capacitor 74 may also be parameterized as disclosed herein for other elements of the model 73. In the model 73, the nonlinear model component 78 may be placed in series with the OCV model 52 and the linear equivalent circuit model 48, which may be done in place of the nonlinear resistor response model 54.

Figure 11:
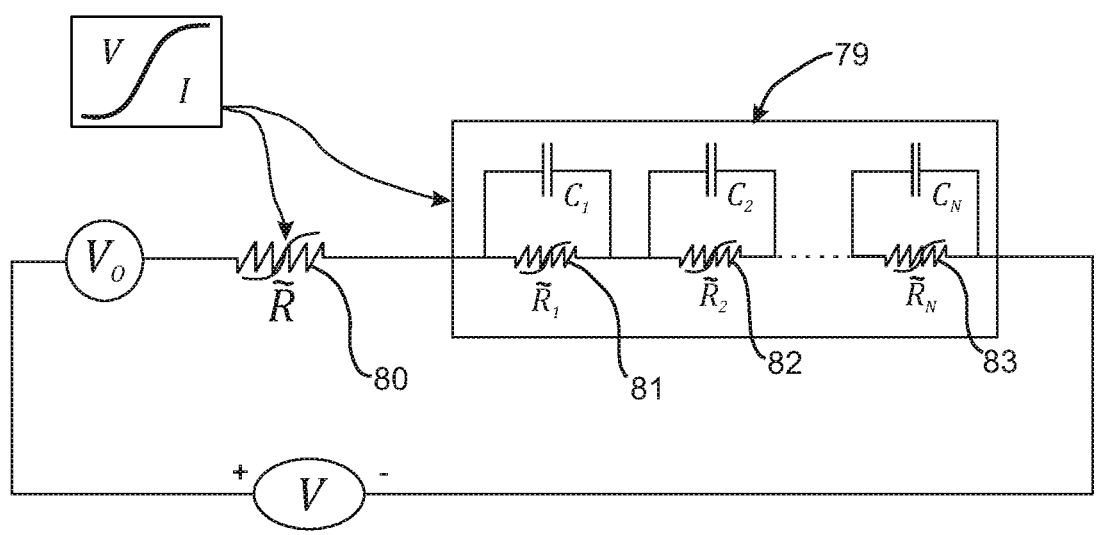
FIG. 11 illustrates a diagram of a model for use with an energy system according to a number of variations.

In a number of variations as illustrated in FIG. 11, characterization testing or other model building tools may show that a nonlinear response may be experienced across a range of frequencies. To accommodate such findings, some or all of the resistors in the R+N(R∥C) circuit model may be replaced with nonlinear resistors 80, 81, 82, 83 to provide the model 79. The model 79 may be denoted as a: $\tilde{R}$+N($\tilde{R}$∥C) type. The nonlinear resistors 80, 81, 82, 83 may be modeled such as by using a controlled current source in characterization testing.

Figure 12:
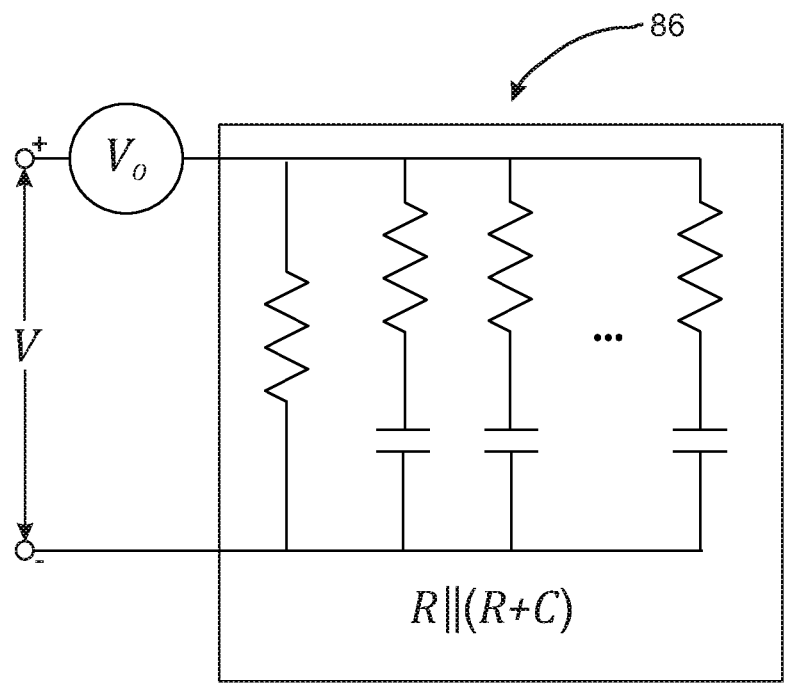
FIG. 12 illustrates a diagram of a model for use with an energy system according to a number of variations.
Figure 13:
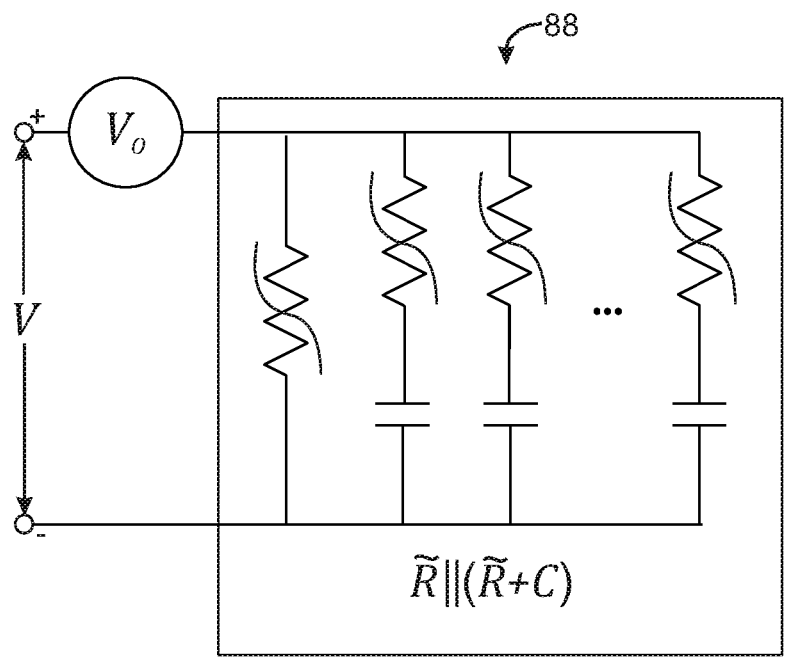
FIG. 13 illustrates a diagram of a model for use with an energy system according to a number of variations.

In a number of variations, the R+N(R∥C) or $\tilde{R}$+N($\tilde{R}$∥C) circuit may be replaced with a R∥(R+C) circuit model 86 of FIG. 12 or the $\tilde{R}$∥($\tilde{R}$+C) circuit model 88 of FIG. 13, respectively. The circuits of FIGS. 12 and 13 may be considered analogues to those previously described. Specifically, the R∥N(R+C) type may be analogous to the circuit of FIG. 2, where all series and parallel connections are interchanged. Also, the $\tilde{R}$∥($\tilde{R}$+C) type may be analogous to the circuit of FIG. 11, where all series and parallel connections are interchanged. The admittance of the circuit model 36 has a form similar to the impedance of circuit models 86, and the reverse is also the case. The admittance of the circuit models 79 has a form similar to the impedance of circuit models 88, and the reverse is also the case.

Figure 14:
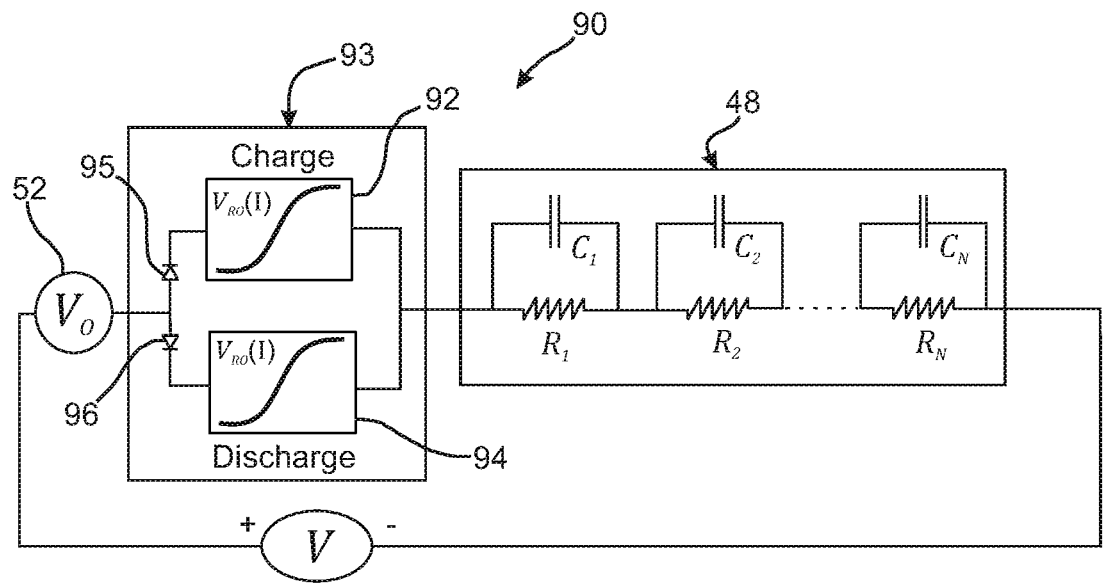
FIG. 14 illustrates a diagram of a model for use with an energy system according to a number of variations.

In a number of variations, for some electrochemical devices that may be used as the storage devices 16, the internal resistance under charge and discharge conditions may be different. For example, the reaction may be asymmetric. Such may be the case with lead-acid batteries, for example. In such cases, the model 90 of FIG. 14 may be applicable. Model 90 has one internal resistance 92 for charging and another internal resistance 94 for discharging. The resistance component 93 may be connected in series with the OCV model 52 and the linear equivalent circuit model 48. With the model 90 it can be seen that, in the case of one lithium ion battery 61 and one lead-acid battery 63 of FIG. 8, the appropriate model may include two branches. One branch may correspond to the lithium ion battery 61 and may include the OCV model 52, nonlinear resistor response model 54, and linear equivalent circuit model 48 may be connected in series to represent the battery's state. A second branch may correspond to the lead-acid battery 63 and may include the OCV model 52, resistance component 93, and linear equivalent circuit model 48 may be connected in series to represent the battery's state.

Figure 15:
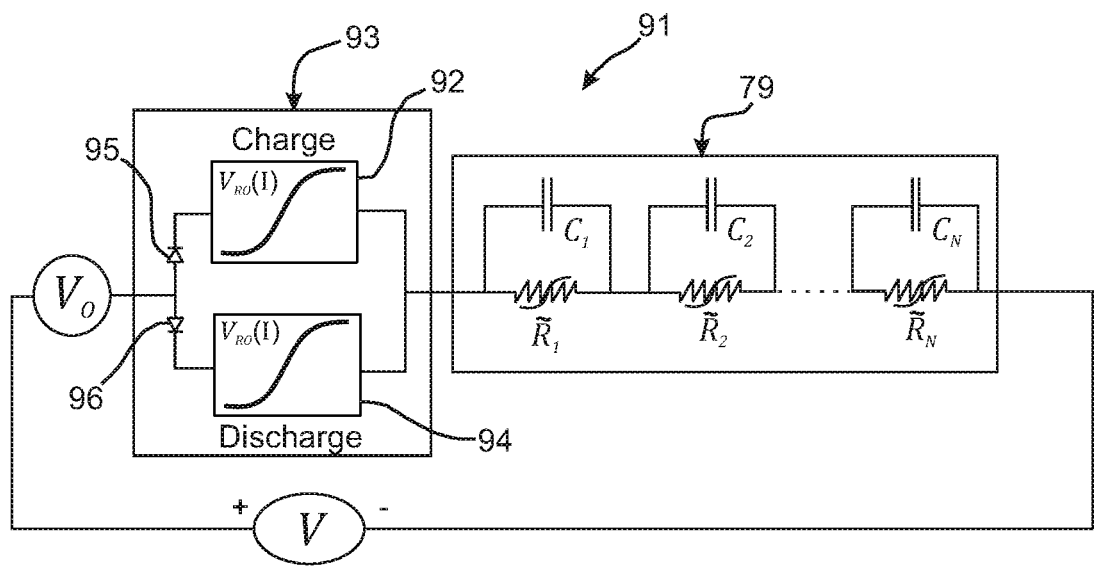
FIG. 15 illustrates a diagram of a model for use with an energy system according to a number of variations.

In a number of variations illustrated in the model 91 of FIG. 15, the resistance component 93 may be connected in series with the OCV model 52 and the nonlinear equivalent circuit model 79. The internal resistances 92, 94 may be connected in parallel and may be paired with diodes 95, 96 respectively. This may mean that only one of the resistances 92, 94 are used during charging or discharging. For example, the diode 95 may be biased so that during charging the resistance 92 may be used, and not during discharging. Similarly, the diode 94 may be biased so that during charging the resistance 94 may not be used, but may be used during discharge. In a number of variations, such an arrangement may be used with the lead-acid battery 63 of FIG. 8.

Figure 16:
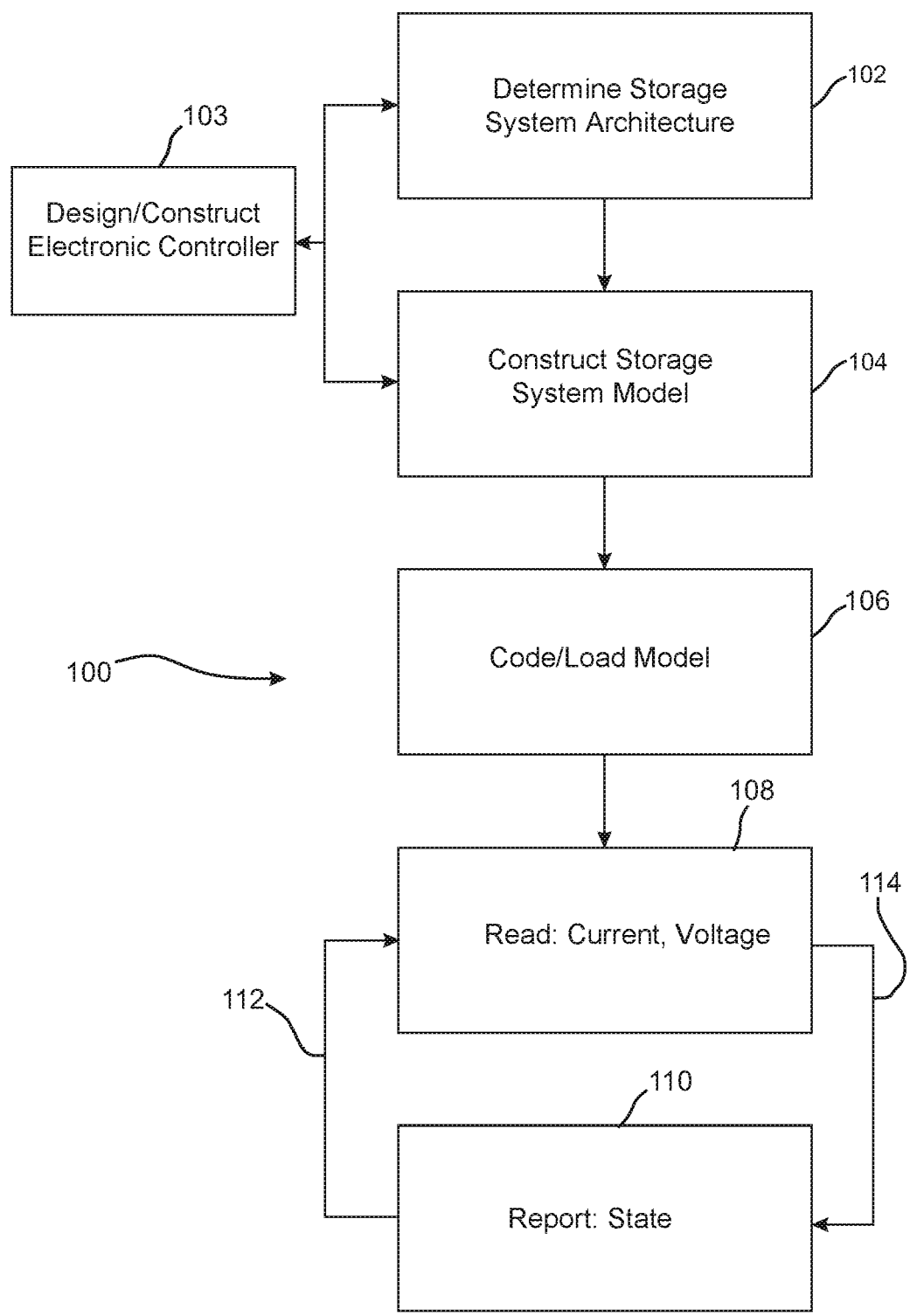
FIG. 16 illustrates methods according to a number of variations.

In a number of variations methods 100, such as illustrated in FIG. 16 may use the models described herein. The methods 100 may begin at step 102 where the architecture of the storage system 14 may be determined. This may include assessing the power capability of different types of devices for use as the storage devices 16 and comparing them to the system requirements. The storage device(s) may be called upon to supply current under wide-ranging temperature and load conditions that may be required by a given application. Accordingly, the storage system 14 may include multiple numbers of, and/or plural types of, storage devices 16. From step 102 the method 100 may proceed to step 104 where a model may be constructed for the selected storage system 14. For example, a model may be constructed according to the variations described in relation to FIGS. 1-15 hereof. The desired state estimation may be accomplished by building a model of the storage system 14, which replicates its characteristics in software/algorithms which predict its behavior in response to various external and internal conditions. In a number of variations, the model constructed at step 104 may include the linear equivalent circuit model 36/linear equivalent circuit model 48. In a number of variations the model constructed at step 104 may include the OCV model 52. In a number of variations, the model constructed at step 104 may include the nonlinear resistor response model 54. In a number of variations, the model constructed at step 104 may include two or three of: the linear equivalent circuit model 36/linear equivalent circuit model 48, the OCV model 52 and/or the nonlinear resistor response model 54, which may be connected in series to form a model branch 53. In a number of variations, the model 60 may include a number of branches 53, each corresponding to one of the storage devices selected in step 102. In a number of variations, the model constructed at step 104 may include the model 69 as a branch corresponding to each supercapacitor with a linear response that may be included in the architecture selected at step 102. In a number of variations, the model constructed at step 104 may include the nonlinear model component 78 in place of the nonlinear resistor response model 54, which may be omitted. In a number of variations, the model constructed at step 104 may include nonlinear resistors such as 80, 81, 82, 83, in place of the resistors 40, 41, 42, 43. This may be done in the linear equivalent circuit model 36/linear equivalent circuit model 48. In a number of variations, in the model constructed at step 104, the linear equivalent circuit model 36/linear equivalent circuit model 48 may be arranged with a R∥(R+C) circuit model 86 of FIG. 12 or the $\tilde{R}\|(\tilde{R}+C)$ circuit model 88 of FIG. 13, instead of a R+N(R∥C) or $\tilde{R}+N(\tilde{R}\|C)$ circuit, respectively. In a number of variations, the model constructed at step 104 may include the resistance component 93, which may be connected in series with the OCV model 52 and the linear equivalent circuit model 48/nonlinear equivalent circuit model 79. The performance characteristics of a typical sample storage device(s) may be measured and the results used to represent copies of the same storage device variation for use in building the models. Basing the storage device performance estimates on data sets or lookup tables constructed from measured data may take into account the factors affecting state. Data acquisition and lookup table construction for storage device characterization may need to be carried out only once for a particular storage device variation. In a number of variations, aspects of the models described herein may be theoretically determined, such as by using computational tools that factor in the variables affecting storage device performance, as opposed to being determined through characterization testing.

In coordination with steps 102 and 104, the method 100 may include step 103 where the electronic controller 20 may be designed and constructed. It will be appreciated that the electronic controller 20 will be integrated to work with the control module 30, and so step 103 may include that process. The computer-readable instructions of the electronic controller 20 may be written in any suitable programming language. The computer-readable instructions and/or functional modules may be in the form of separate integrated programs or modules. The control system 18 may utilize any suitable operating system. From step 104, the method 106 may proceed to step 106 where the model constructed at step 104 may be coded and loaded to the electronic controller 20, which may also include such a process for at least parts of the control module 30.

In a number of variations the method 100 may proceed to step 108 where single situs current and voltage readings may be obtained from the storage system 14. The single situs current and voltage readings may be obtained from the sensor(s) 32. The single situs current and voltage readings, representative of all storage devices 16 in the storage system 14, may be processed through the model constructed at step 104 in the electronic controller 20. In addition, temperature reading may be obtained from the sensor 34. The sensors 32, 34 may provide analogue inputs representing voltages, currents and temperatures for the model. A/D converters may translate these inputs into digital form. The models described herein may use these inputs to estimate the desired state information, or other, status of the storage system 14, at any instant in time. In a number of variations a predicted energy storage system voltage based, at least in part, on the model constructed at step 104 may be determined, and a state of the energy storage system may be determined based on the predicted storage system voltage. For example, the predicted voltage may correlate with the SOC of the energy storage system. Correlation data may be collected during characterization testing and may be maintained in the electronic controller 20, which may be used to "lookup," the SOC based on the voltage predicted. The method 100 may proceed to step 110 where the electronic controller may report, such as to the control module 30, state information on the storage system 14. The information may include SOC, SOP, and/or other desired state details. In a number of variations, the information may include regressed parameter values for the storage system 14, which may be segregated such as by each branch 53 for individual model components 51. The current, voltage and/or temperature readings may be obtained at specified intervals. In dynamic applications such as automotive vehicles, inputs for voltage and current may be monitored every 0.1 second to ensure that no significant charge flows or critical events are missed. The state prediction may then be completed between the sampling intervals. The temperature, which may change less rapidly, may be sampled at longer intervals, such as 10 seconds. In a number of variations the method 100 may implement a control action in the product 10 based on the estimated energy storage system state. In a number of variations of the method 100, the control system 18 may monitor and control operations of the battery system, which, in addition to state determination, may include state reporting/readout, storage device 16 protection, charge control, interfacing with other systems to manage demand (such as by managing the system load 22), and/or balancing. The method 100 may proceed in an execution loop 112, 114, for ongoing state estimation of the storage system 14 to maintain real-time updated state data.

Through the foregoing variations, products, systems and methods the enhanced performance in the state estimation of energy systems may be provided. The description of variants is only illustrative of components, elements, acts, product and methods considered to be within the scope of the invention and are not in any way intended to limit such scope by what is specifically disclosed or not expressly set forth. The components, elements, acts, product and methods as described herein may be combined and rearranged other than as expressly described herein and still are considered to be within the scope of the invention.

Variation 1 may involve a product for estimating the state of an energy storage system. At least one sensor may monitor a voltage and a current of the energy storage system. An electronic controller may be communicatively coupled with the energy storage system and may receive input from the sensor. A circuit may be representative of the energy storage system and may be appropriately defined in the electronic controller. The circuit may estimate a state of the energy storage system from a reading of the voltage and the current.

Variation 2 may include the product of variation 1 wherein the state may include a state of charge of the energy storage system.

Variation 3 may include the product of variation 1 wherein the energy storage system may include at least one battery and at least one supercapacitor.

Variation 4 may include the product of variation 3 wherein the circuit may include a number of branches. A first branch may correspond to one battery and may be the same as a second branch that may correspond to one supercapacitor.

Variation 5 may include the product of variation 3 wherein the circuit may include a number of branches. A first branch may correspond to one battery and may include a nonlinear element. A second branch may correspond to one supercapacitor and may include a linear element instead of the nonlinear element.

Variation 6 may include the product of variation 1 wherein the energy storage system may include at least one lead-acid battery, and may include cat least one lithium ion battery. The circuit may include a number of branches one of which may correspond to the lead-acid battery and one of which may correspond to the lithium ion battery.

Variation 7 may include the product of variation 1 wherein the circuit may include a nonlinear resistance model component that may include a nonlinear resistance element and a linear capacitor element that may be in parallel to the nonlinear resistance element.

Variation 8 may include the product of variation 7 and may include an open circuit voltage model component and a linear equivalent circuit component, both of which may be in series with the nonlinear resistance model component.

Variation 9 may include the product of variation 1 wherein the circuit may include a number of parallel resistor-capacitor pairs that may be in series with one another. At least one of the parallel resistor-capacitor pairs may include a nonlinear resistor Variation 10 may include the product of variation 1 wherein the circuit may include a number of series resistor-capacitor pairs that may be in parallel with one another Variation 11 may include the product of variation 1 wherein the circuit may include a nonlinear resistance model component that may have a charge nonlinear resistance element, and a discharge nonlinear resistance element, which may be arranged in parallel with one another. Each of the charge nonlinear resistance element and the discharge nonlinear resistance element may be paired with a diode element. The diode elements may have opposite bias relative to each other.

Variation 12 may involve a method and may include providing an energy storage system that at a given time may have a composite system voltage and a composite system current. One or more storage devices may be assembled in the energy storage system. A model of the energy storage system may be constructed that may have an individual branch that may correspond to each individual storage device of the one or more storage devices. The composite system voltage and the composite system current may be measured. A state of the energy storage system may be determined from the model and based on the composite system voltage and the composite system current.

Variation 13 may include the method of variation 12 and may include assembling the one or more storage devices to include a battery and a supercapacitor.

Variation 14 may include the method of variation 13 and may include constructing the model with a first branch that may correspond to the battery and a second branch that may correspond to the supercapacitor.

Variation 15 may include the method of variation 14 and may include a nonlinear element in the first branch, and a linear element in the second branch instead of the nonlinear element.

Variation 16 may include the method of variation 12 and may include constructing the model with an open circuit voltage model component. A nonlinear resistance model component may be added to the model in series with the open circuit model component. A linear equivalent circuit model component may be added to the model in series with both the open circuit model component and the nonlinear resistance model component.

Variation 17 may include the method of variation 12 and may include providing no more than one current sensor for the purposes of measuring current of the energy storage system and supplying the measured current for the determination of the state. In addition, no more than one voltage sensor may be provided for the purposes of measuring voltage of the energy storage system and supplying the measured voltage for the determination of the state.

Variation 18 may include the method of variation 12 and may include constructing the model with a number of parallel resistor-capacitor pairs that may be in series with one another. At least one of the parallel resistor-capacitor pairs may include a nonlinear resistor.

Variation 19 may include the method of variation 12 and may include constructing the model to include an open circuit voltage model component, a nonlinear resistance model component, and a linear equivalent circuit model component. Characterization testing of the energy storage system may be conducted to construct the open circuit voltage model component and the nonlinear resistance model component. The characterization testing may include measuring a composite voltage of the energy storage system and may include measuring a composite current through the energy storage system.

Variation 20 may include the method of variation 12 and may include assembling a battery that may store energy electro-chemically in the at least one storage device. A supercapacitor that stores energy electro-statically may be assembled in the at least one storage device. The model may be constructed with a first branch that may correspond to the battery. The model may be constructed with a second branch that may correspond to the supercapacitor. An open circuit voltage model component, a nonlinear resistance model component, and a linear equivalent circuit model component may be added to the first branch. An open circuit voltage model component, a linear resistance model component, and a linear equivalent circuit model component may be added to the second branch.

The above description of select variations within the scope of the invention is merely illustrative in nature and, thus, variations or variants thereof are not to be regarded as a departure from the spirit and scope of the invention.

What is claimed is:

1. A product comprising:
   an energy storage system including plural energy storage devices;
   a first sensor configured to monitor a voltage and a current of the energy storage system;
   a second sensor configured to monitor a temperature of the energy storage system;
   an electronic controller communicatively coupled with the energy storage system and configured to:
   represent, in a model, each of the plural energy storage devices by a sum of an open circuit voltage model, a resistor response model and a response from a linear equivalent circuit model representing a behavior of the plural energy storage devices;
   select for each of the energy storage devices and from the open circuit voltage model, a first voltage value corresponding to a capacity of the respective energy storage device and the temperature;
   select for each of the energy storage devices and from the resistor response model, a second voltage value at the current and the temperature of the energy storage system;
   determine, from the linear equivalent circuit model, a third voltage value based on a resistor-capacitor pair representation for each of the plural energy storage devices;
   estimate, via the model and using the first, second and third voltage values, a state of the energy storage system;
   initiate a control action, to manage the energy storage system, in the product based on the estimated state of the energy storage system including at least one of a monitor and a control operation of the energy storage system; and
   optimize, using the control action, functionality of the plural energy storage devices.

2. The product of claim 1 wherein the state comprises a state of charge of the energy storage system, and wherein the control action comprises managing a load on the energy storage system to maintain the state of charge.

3. The product of claim 1 wherein the plural energy storage devices include a battery and a supercapacitor, and wherein, the resistor response model is nonlinear for the battery and the resistor response model is linear for the supercapacitor.

4. The product of claim 3 wherein the model comprises a circuit that includes a number of branches including a first branch and a second branch, wherein the first branch corresponds to the battery and the second branch corresponds to the supercapacitor; and wherein the electronic controller is configured to determine a first state of the battery and a second state of the supercapacitor using a single reading of the voltage and the current without input from other sensors.

5. The product of claim 3 wherein the model comprises a circuit that includes a number of branches including a first branch and a second branch, wherein the first branch corresponds to the battery and the second branch corresponds to the supercapacitor; wherein the first branch includes a nonlinear element and wherein a second branch includes a linear element instead of the nonlinear element.

6. The product of claim 1 wherein the energy storage system includes at least one lead-acid battery, and at least one lithium ion battery, wherein the model comprises a circuit that includes a number of branches one of which corresponds to the lead-acid battery and one of which corresponds to the lithium ion battery, wherein the number of branches corresponding to the lead acid battery and the number of branches corresponding to the lithium ion battery are identical to each other.

7. The product of claim 1 wherein the electronic controller is further configured to model the energy storage system via a circuit representative of the energy storage system that includes a nonlinear resistance model component with a nonlinear resistance element and a linear capacitor element in parallel to the nonlinear resistance element.

8. The product of claim 7 wherein the circuit includes an open circuit voltage model component and a linear equivalent circuit component, both in series with the nonlinear resistance model component.

9. The product of claim 1 wherein the electronic controller is further configured to model the energy storage system via a circuit representative of the energy storage system that comprises a number of parallel resistor-capacitor pairs in series with one another, wherein at least one of the parallel resistor-capacitor pairs includes a nonlinear resistor.

10. The product of claim 1 wherein the electronic controller is further configured to model the energy storage system via a circuit representative of the energy storage system that comprises a number of series resistor-capacitor pairs in parallel with one another.

11. The product of claim 1 wherein the electronic controller is further configured to model the energy storage system via a circuit representative of the energy storage system that includes a nonlinear resistance model component with a charge nonlinear resistance element, and a discharge nonlinear resistance element, arranged in parallel with one another, wherein each of the charge nonlinear resistance element and the discharge nonlinear resistance element is paired with a diode element, the diode elements having opposite bias relative to each other.

12. A method comprising: constructing an energy storage system that at a given time has a composite system voltage and a composite system current; assembling plural storage devices in the energy storage system; constructing a model of the energy storage system as a sum of an open circuit voltage, a resistor response model represented as a function of the composite system current, a storage device capacity, and temperature, and a response from a linear equivalent circuit model that includes a resistor-capacitor pair for each of the plural energy storage devices, with a number of branches, one of which corresponds to each individual storage device of the plural storage devices; measuring, by at least one sensor, the composite system voltage and the composite system current; selecting, by a controller for each of the plural storage devices and from the open circuit voltage model, a first voltage value based on a capacity of the respective energy storage device and the temperature; selecting, by the controller for each of the energy storage devices and from the resistor response model, a second voltage value based on the current and the temperature of the energy storage system; determining, by the controller from the linear equivalent circuit model, a third voltage value based on a resistor-capacitor pair representation for each of the plural energy storage devices; determining, by the controller, a state of the energy storage system, including of the plural storage devices, from the model and based on the first, second and third voltage values; initiating, by the controller, a control action, to manage the energy storage system, based on the estimated state of the energy storage system including at least one of a monitor and an operation of the energy storage system; and
optimizing, by the control action, functionality and life of the plural storage devices in use.

13. The method of claim 12 comprising assembling the plural storage devices to include a battery and a supercapacitor; and constructing the resistor response model in a nonlinear form for the battery and in a linear form for the supercapacitor.

14. The method of claim 13 comprising constructing the model with a first branch corresponding to the battery and a second branch that corresponds to the supercapacitor.

15. The method of claim 14 comprising including a nonlinear element in the first branch, and including a linear element in the second branch instead of the nonlinear element.

16. The method of claim 12 comprising constructing the model with an open circuit voltage model component; adding a nonlinear resistance model component to the model in series with the open circuit model component; and adding a linear equivalent circuit model component to the model in series with both the open circuit model component and the nonlinear resistance model component.

17. The method of claim 12 comprising measuring, by at least one current sensor, a current of the energy storage system and supplying the measured current for the determination of the state; and, measuring, by at least one voltage sensor, a voltage of the energy storage system and supplying the measured voltage for the determination of the state.

18. The method of claim 12 comprising constructing the model with a number of parallel resistor-capacitor pairs in series with one another, and, providing at least one of the parallel resistor-capacitor pairs with a nonlinear resistor.

19. The method of claim 12 comprising constructing the model to include an open circuit voltage model component, a nonlinear resistance model component, and a linear equivalent circuit model component; conducting characterization testing of the energy storage system to construct the open circuit voltage model component and the nonlinear resistance model component, wherein the characterization testing includes measuring a composite voltage of the energy storage system and includes measuring a composite current of the energy storage system.

20. An energy storage system comprising: a battery that stores energy electro-chemically; a supercapacitor that stores energy electro-statically; a first sensor; a second sensor; and a controller configured to:
receive, from the first sensor, a single situs voltage reading; receive, from the second sensor, a single situs current reading; model the energy storage system via a circuit that comprises a first branch that corresponds to the battery and represents the battery by a first sum of a first open circuit voltage model component that is a function of a first capacity of the battery and a temperature, a first nonlinear resistance model component that is a function of the single situs current reading, the first capacity and the temperature, and a first linear equivalent circuit model component configured as a first R+N(R∥C) model where R is a resistor, C is a capacitor, and N is a number of parallel resistor-capacitor combinations, wherein the first open circuit model component, the first nonlinear resistance model component, and the first linear equivalent circuit model component are in series with each other in the first branch; a second branch in parallel with the first branch, wherein the second branch corresponds to the supercapacitor and represents the supercapacitor by a second sum of a second open circuit voltage model component that is a function of a second capacity of the supercapacitor and the temperature, a second linear resistance model component that is a function of the single situs current reading, the second capacity and the temperature, and a second linear equivalent circuit model component configured as a second R+N(R∥C) model, wherein the second open circuit model component, the second nonlinear resistance model component, and the second linear equivalent circuit model component are in series with each other in the second branch;
estimate, via the model and using the single situs voltage reading and the single situs current reading, a state of the energy storage system in total and of each of the battery and the supercapacitor;
maintain, using the estimated state of the energy storage system, real-time estimated state data;
initiate a control action, to manage the energy storage system, in the product based on the real-time estimated state data, including at least one of a monitor and an operation of the energy storage system; and
optimize, using the control action, functionality of the battery and the supercapacitor.

* * * * *